(12) United States Patent
Frankenberg et al.

(10) Patent No.: US 11,360,156 B2
(45) Date of Patent: Jun. 14, 2022

(54) METHOD, DEVICE AND SYSTEM FOR DETERMINING AN ARC ON A POWER TRANSMISSION LINE

(71) Applicant: Siemens Aktiengesellschaft, Munich (DE)

(72) Inventors: Robert Frankenberg, Vienna (AT); Gottfried Ira, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 7 days.

(21) Appl. No.: 16/885,397

(22) Filed: May 28, 2020

(65) Prior Publication Data
US 2020/0379055 A1    Dec. 3, 2020

(30) Foreign Application Priority Data
May 29, 2019   (EP) .................................. 19177359

(51) Int. Cl.
*G01R 31/52*   (2020.01)
*G01R 15/14*   (2006.01)
(Continued)

(52) U.S. Cl.
CPC ........... *G01R 31/52* (2020.01); *G01R 15/144* (2013.01); *G01R 15/16* (2013.01); *G01R 15/18* (2013.01);
(Continued)

(58) Field of Classification Search
CPC ............ G01R 31/52; G01R 31/08–086; G01R 15/18; G01R 15/16; G01R 15/144; G01R 31/127; H02H 1/0015
See application file for complete search history.

(56) References Cited

U.S. PATENT DOCUMENTS 3,588,611 A * 6/1971 Lambden et al. ..... G01R 31/08
361/88
4,868,506 A * 9/1989 DiStefano .............. G01R 31/54
324/543
(Continued)

FOREIGN PATENT DOCUMENTS

CN      108008244       5/2018
KR      101820162 B1    1/2018

OTHER PUBLICATIONS

EP Search Report dated Nov. 18, 2019 based on EP19177359 filed May 29, 2019.
(Continued)

*Primary Examiner* — Patrick Assouad
*Assistant Examiner* — Demetrius R Pretlow
(74) *Attorney, Agent, or Firm* — Cozen O'Connor

(57) ABSTRACT

Method, device and system for determining a line property in the form of an arc on a power transmission line, wherein at least one test signal is coupled into the power transmission and an interference signal at an interference point, which is formed by the arc, is generated along the power transmission line with the aid of the at least one test signal, which interference signal is acquired as at least one measuring signal, and the line property is determined from the at least one measuring signal, where the line property is determined by detecting at least one intermodulation product from the at least one test signal and the mains signal of the power transmission line in the at least one measuring signal.

17 Claims, 4 Drawing Sheets

(51) Int. Cl.
  *G01R 15/16* (2006.01)
  *G01R 15/18* (2006.01)
  *G01R 31/08* (2020.01)
  *G01R 31/12* (2020.01)
  *H02H 1/00* (2006.01)

(52) U.S. Cl.
  CPC ....... *G01R 31/085* (2013.01); *G01R 31/1272* (2013.01); *H02H 1/0015* (2013.01)

(56) References Cited

U.S. PATENT DOCUMENTS

| | | | | |
|---|---|---|---|---|
| 5,825,598 | A * | 10/1998 | Dickens | H01H 73/14 361/42 |
| 6,798,211 | B1 * | 9/2004 | Rockwell | G01R 31/085 324/527 |
| 2004/0066593 | A1 * | 4/2004 | Kolker | G01R 31/52 361/42 |
| 2004/0174173 | A1 * | 9/2004 | Elms | G01R 31/52 324/509 |
| 2012/0176712 | A1 | 7/2012 | Kim et al. | |
| 2013/0182753 | A1 * | 7/2013 | Delforce | H04B 17/17 375/228 |
| 2013/0221973 | A1 * | 8/2013 | Whisenand | G01R 31/005 324/501 |
| 2013/0226479 | A1 | 8/2013 | Grosjean | |
| 2014/0067291 | A1 * | 3/2014 | Balog | G01R 31/52 702/58 |
| 2014/0347066 | A1 * | 11/2014 | Zach | G01R 31/1272 324/537 |
| 2015/0130477 | A1 * | 5/2015 | Berland | G01R 31/74 324/550 |
| 2016/0248240 | A1 * | 8/2016 | Miklis | H02H 1/0015 |
| 2017/0102426 | A1 * | 4/2017 | Schweitzer, III | G01R 31/086 |
| 2017/0343596 | A1 * | 11/2017 | Misumi | G01R 31/1272 |
| 2018/0115144 | A1 | 4/2018 | Murnane | |
| 2020/0049755 | A1 * | 2/2020 | Cabanillas | G01R 31/08 |

OTHER PUBLICATIONS

Keenan J et al: "Arc Detectors", 20th International Telecommunications Energy Conference. INTELEC '98. San Francisco, CA, Oct. 4-8, 1998; [INTELEC. International Telecommunications Energy Conference], New York, NY : IEEE, US, pp. 710-715, 1998.

Office Action dated Apr. 9, 2021 issued in Australian Patent Application No. 2020202799.

Office Action dated Oct. 30, 2020 issued in Australian Patent Application No. 2020202799.

Chen, J., "High Impedance Arcing Fault Detection in Medium Voltage Distribution Networks," A Thesis In Fulfilment Of The Requirement For The Degree Of Doctor Of Philosophy, UNSW Sydney, pp. 1-301, Jul. 2017.

Lee, W. et al., "A Novel Approach for Arcing Fault Detection for Medium-/Low-Voltage Switchgear," IEEE Transactions on Industry Applications, vol. 45, No. 4, Aug. 2009, pp. 1475-1483.

* cited by examiner

METHOD, DEVICE AND SYSTEM FOR DETERMINING AN ARC ON A POWER TRANSMISSION LINE

BACKGROUND OF THE INVENTION

1. Field of the Invention

The invention relates to a method for determining a line property in the form of an arc on a power transmission line, where at least one test signal is coupled into the power transmission line, and an interference signal is generated at an interference point along the power transmission line with the aid of the at least one test signal, where the interference signal is acquired as at least one measuring signal and the line property is determined from the at least one measuring signal.

The invention also relates to a device and a system for determining a line property in the form of an arc on a power transmission line, comprising at least one coupler for coupling at least one test signal into and for coupling at least one measuring signal out of the power transmission line, and a processing device with a control device, at least one generator device and at least one measuring device, where the control device is configured to generate the at least one test signal with the aid of the at least one generator device, and to supply the at least one test signal into the power transmission line with the aid of the at least one coupler, and to couple at least one interference signal, which is generated at least one interference point along the power transmission line with the aid of the at least one test signal, out of the power transmission line with the aid of the at least one coupler, and to acquire the at least one measuring signal with the aid of the at least one measuring device.

2. Description of the Related Art

With transmission networks, there is the desire to identify interferences as quickly as possible to ensure high availability or high network security. However, the conventional prior art methods frequently have inadequate reliability when interferences are identified.

For instance, momentary values for current and voltage can be acquired via "synchro phasor" measurements with the aid of distributed sensors. Attempts can subsequently be made to deduce a possible interference. However, a corresponding realization is complicated and expensive because the must be synchronized with one another in an elaborate manner or complicated measurements have to be performed.

By analyzing the frequency spectrum of harmonics of the frequency of the mains voltage, other methods attempt to make a corresponding statement with respect to identifying interferences which, however, does not always result in satisfactory results.

US 2018/115144 A1 and US 2013/226479 A1 each describe a system for identifying arcs, which is based on a general analysis of the frequency spectrum, or a narrowband evaluation of harmonics of a mains voltage with an occurring arc. However, its identification reliability remains below a desired accuracy.

The reliable identification of interferences that can be caused by a flashover or discharges in the form of an intermittent electric arc in a power supply system is of significant relevance. The identification of small residual currents is particularly important, i.e., "high-impedance faults" with less than 10 amperes. Such interferences, in particular arcs, can be described as a line property of a power transmission line.

Arcs occurring in electric power engineering during switching operations are referred to as switch arcs. Unwanted arcs that often result in damage or accidents are referred to as interference arcs.

An arc is produced with a sufficiently high electric potential difference and current density as a result of impact ionization. The gas discharge forms a plasma, in which particles, such as atoms or molecules, are ionized at least partially. The free charge carriers result in the gas becoming electrically conductive. The majority of plasmas are virtually neutral, and the number of ions and electrons is therefore identical. The ions are essentially slower compared with much lighter electrons. Consequently, the electrons are often almost exclusively relevant to current transportation.

The reliable identification of one-time or intermittent arcs, particularly those with low currents ("high impedance fault" with less than ten amperes), is frequently difficult in a power supply system across large distances.

An interference signal generated directly by an arc can be very wideband in its frequency range. The high dispersion of power lines can unfavorably affect the wideband interference signal such that after a corresponding distance along a power line it is no longer useful for a reliable identification.

An interference signal generated directly by an arc can be very wideband in its frequency range. The high dispersion of power lines can unfavorably affect the wideband interference signal such that after a corresponding distance along a power line it is no longer useful for a reliable identification.

SUMMARY OF THE INVENTION

It view of the foregoing, it is an object of the invention to provide a method that overcomes the disadvantages in the prior art and that permits the identification of interferences in medium or high voltage networks reliably and cost-effectively.

This and other objects and advantages are achieved in accordance with the invention by a method for determining a line property in the form of an arc on a power transmission line, where at least one test signal is coupled into the power transmission line, and an interference signal is generated at an interference point along the power transmission line with the aid of the at least one test signal, where the interference signal is acquired as at least one measuring signal and the line property is determined from the at least one measuring signal, where the line property is determined by detecting at least one intermodulation product from the at least one test signal and the mains signal of the power transmission line in the at least one measuring signal.

By inventively determining the line property, an occurrence of an arc can be reliably identified. As a result, it is possible for an interference point, which generates intermodulation products from a test signal and a mains signal of the power transmission line to be easily and reliably identified. For instance, when opening or closing high or medium voltage switches, a flashover in the form of an arc or a continuous arc may result between the contacts of a switch. Such an arc may result in an electric signal, which is fed into the high voltage line, generating an interference signal at the location of the arc. A switch of this type can be an isolator connected in series with the power transmission line, for example. An electrical non-linear behavior is characteristic of an arc of this type and can be described with the aid of a negative differential resistance.

If a test signal is applied to an interference point with a negative differential resistance, intermodulation products of the test signal and the useful signal, i.e., the mains voltage with the mains frequency, are generated and can be measured and evaluated.

The intermodulation refers to the emergence of frequencies when two or more different frequencies are processed by a system with a non-linear transmission function. In the simplest case of two different frequencies $f_1$ and $f_2$, which are routed through a system with a non-linear transmission function, a sum of frequencies that are referred to as intermodulation products is formed by intermodulation, in the form:

$k_1 f_1 \pm k_2 f_2$ or $k_1 f_1 \pm k_2 f_2 \pm k_3 f_3$ for a case with three frequencies, with $k_1, k_2, k_3 \in \mathbb{Z}$. The order O is $O = |k_1| + |k_2|$ or $O = |k_1| + |k_2| + |k_3|$.

Some intermodulation products in the case of two frequencies $f_1$ and $f_2$ and in the case of three frequencies $f_1$, $f_2$ and $f_3$ are cited by way of example in Table 1:

TABLE 1

Order of intermodulation signals

| Order | Intermodulation products with two frequencies | Intermodulation products with three frequencies |
|---|---|---|
| 2nd order | $f_1 \pm f_2$ | |
| 3rd order | $2f_1 \pm f_2$ | $f_1 \pm f_2 \pm f_3$ |
| | $f_1 \pm 2f_2$ | |
| 4th order | $3f_1 \pm f_2$ | $2f_1 \pm f_2 \pm f_3$ |
| | $f_1 \pm 3f_2$ | $f_1 \pm 2f_2 \pm f_3$ |
| | $2f_1 \pm 2f_2$ | |
| 5th order | $3f_1 \pm 2f_2$ | $2f_1 \pm 2f_2 \pm f_3$ |
| | $2f_1 \pm 3f_2$ | $f_1 \pm 2f_2 \pm 2f_3$ |
| | $4f_1 \pm f_2$ | $2f_1 \pm f_2 \pm 2f_3$ |
| | $f_1 \pm 4f_2$ | $3f_1 \pm f_2 \pm f_3$ |
| | | $f_1 \pm 3f_2 \pm f_3$ |
| | | $f_1 \pm f_2 \pm 3f_3$ |

The frequency $f_1$ can be the network frequency of a mains signal (e.g. 50 or e.g. 60 Hz), for instance, and the frequencies $f_2$ or $f_3$ can be included in a test signal.

Intermodulation products can also be generated with more than three frequencies in a test signal.

The inventive method also has the advantage that flashovers in the network can also be reliably identified at a large distance from a central point, such as for instance a substation.

Essentially the method can be used for any line type, which is suitable for power transmission. Such line types are, for instance, overhead lines, cables, gas-insulated lines (GIL) or overhead contact wires for railway systems in various configurations, such as multi-phase lines, single-phase lines or direct current lines. In most instances multi-phase lines are used for power transmission in the high and medium voltage range.

An indicator of the detection of a cable break or a high-resistance ground fault without a line interruption, such as is caused for instance as a result of a sagging overhead line or the line coming into contact with a tree, can be formed as a line property.

The line property can also indicate the location of a detected fault. The interference point can be formed by an arc, for instance. In other words, a test signal fed into a power transmission line can be generated at the interference point by the non-linear property of the arc, where the interference signal has intermodulation products and can be detected and evaluated as a measuring signal by a processing device.

A number of test signals can also be fed into the same power transmission line, such as at different locations, in order to increase the coverage of the test device.

Furthermore, a shared test signal with a number of buffer frequencies can be used in order to generate is targeted manner intermodulation products that have particularly advantageous properties as a result of their frequency response, for instance, with the propagation in the energy transmission network, and as a result further improve the rate of identification or its reliability.

In one embodiment of the invention, the arc is caused as a result of a switching process of a high voltage switch connected to the power transmission line. This ensures that the arc can be generated in a targeted manner, and thus the line property or an identification of the arc can be determined systematically.

High voltage switches can be circuit breakers, load switchers, load disconnectors, or isolators. High voltage switches are used in substations, load distributor plants or also in the field of power plants and are controlled remotely from control centers. Such High voltage switches can be equipped with a motor drive, a spring-brake drive or a compressed air drive. Compact designs can be found in gas-insulated switching plants.

When used in the rail or transport sector, a current collector of a vehicle, such as an electric locomotive or a trolley bus, for connection with a contact wire mounted on the track can be understood as a high voltage switch.

In another embodiment of the invention, the time instant of the switching process is taken into account when determining the at least one line parameter. In this case, the location and time instant of the arc are known. As a result, a detected measuring signal can be uniquely assigned to the switching process to be triggered.

In a further embodiment of the invention, the line property is determined or identified by detecting odd-numbered intermodulation products in the measuring signal. This achieves a particularly reliable detection of an arc. In this way, the detection of the arc can be easily distinguished from other interference influences, which also generate even-numbered intermodulation products in the measuring signal.

In yet another embodiment of the invention, the line property is determined or identified by at least one intermodulation product, which has at most the tenth order. As a result, a particularly reliable detection of an arc is achieved.

In a further embodiment of the invention, the at least one line property is determined or identified by at least two intermodulation products. This means that the reliability when determining the line parameter can be further improved.

In another embodiment of the invention, the line property is determined or identified by the ratio of amplitude and/or phase delays of the at least two intermodulation products. As a result, this means that the reliability when determining the line parameter can be further improved because the signal-to-noise ratio can be increased.

In one embodiment of the invention, the at least one line property additionally is determined or identified by at least one harmonic of the at least one test signal and/or the at least one intermodulation product. As a result, the reliability can be further improved when determining the line parameter.

In yet another embodiment of the invention, the at least one test signal is narrowband, i.e., the at least one test signal has a ratio between the bandwidth and the mean frequency of the test signal of less than 10%, preferably less than 5%, particularly preferably less than 3% or less than 1.5%. This means that the measuring signal is not significantly impaired by dispersion on the power transmission line.

In a still further embodiment of the invention, the at least one reference signal has a frequency that is greater by a factor 20 than the mains frequency of the power transmission line, preferably greater by a factor 50, particularly preferably greater by a factor 500 or 100. This means that the measuring signal in the frequency range is placed apart from frequencies that are caused by general interferences on the power transmission line.

The line dispersion of a power transmission line, such as a multiphase mains line, can be considered to be essentially constant in the case of signals of less than 1 kHz bandwidth. As a result, the amplitudes of individual mixed products relative to one another can be considered approximately as independent of the mains line, between the flashover and the measuring device.

In another embodiment of the invention, at least one phase relationship between the at least one test signal and the at least one measuring signal is determined, which is used to determine the location of the occurrence of the interference point of the power transmission line. This facilitates localization of the interference point of the power transmission line.

It is also object of the invention to provide a device, where a processing device of the device is configured perform the disclosed embodiments of the method in accordance with invention and to determine the at least one line property from the at least one measuring signal or to identify the arc.

In an embodiment of the invention, the power transmission line is an overhead line, a cable or a gas-insulated line of a power transmission system.

It is a further object of the invention to provide a system for determining a line property in the form of an arc or for identifying the arc of a power transmission line in the form of an overhead contact wire, where the system comprises an electrically operated means of transport with a current collector for connection with the overhead contact wire and an inventive device, where the interference point is formed by an arc between the overhead contact wire and the current collector. Here, the overhead contact wire is provided for an electrically operated means of transport, which obtains the energy for operating the means of transport from the power transmission line, for instance by way of a current collector.

The electrically operated vehicle or means of transport can be a train, a tram, a bus or a heavy goods vehicle, for example. This means that an electric coupling of a moveable electrically operated vehicle to an overhead contact wire can be tested once or also continuously during the journey. This makes it possible to test the wear on the current collector or the overhead contact wire, for instance, by the number or intensity of arcs being evaluated.

Other objects and features of the present invention will become apparent the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is described below in more detail with reference to exemplary embodiments shown in the appended drawings, in which.

DETAILED DESCRIPTION OF THE EXEMPLARY EMBODIMENTS

Figure 1:
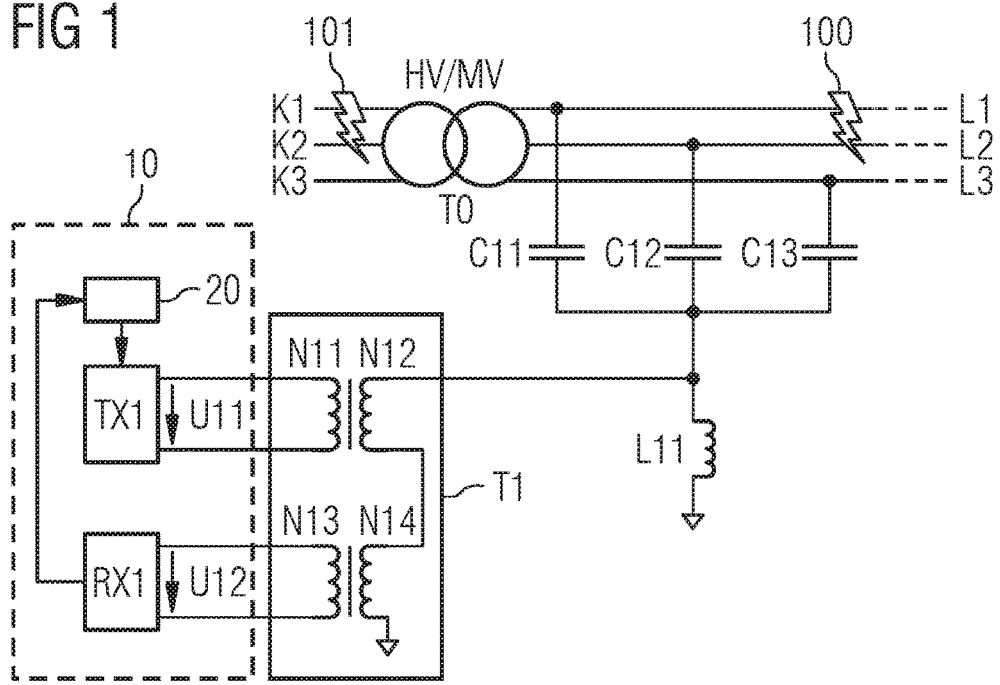
FIG. 1 is a first exemplary embodiment of a block diagram of a circuit arrangement with a coupling of a reference signal to all phases of the power transmission line in accordance with the invention.

FIG. 1 shows a first exemplary embodiment of an inventive device with a coupling of a reference signal to all phases of a three-phase power transmission line.

The invention can be formed by an electronic circuit, which represents a device for determining at least one line property in the form of an arc on a power transmission line K1-K3, L1-L3 in the form of a multiphase line.

The power transmission line K1-K3 represents a high voltage line and the power transmission line L1-L3 a medium voltage line, where the individual lines of the two power transmission lines K1-K3, L1-L3 are coupled to one another by a corresponding transformer T0.

A processing device 10 has a control device 20, a generator device TX1 and a measuring device RX1. The control device 20 is configured to generate a test signal U11 with the aid of the generator device TX1 and to feed the same into the power transmission line L1-L3 with the aid of the coupler.

The device in FIG. 1 has a coupler for coupling a signal U11 into the power transmission line L1-L3 and for coupling a signal U12 out from the power transmission line L1-L3. In this example the coupler is formed by a corresponding coupling circuit with a transformer T1 with windings N11, N12, N13 and N14, capacitors C11-C13 and an inductor L11.

The windings N11, N12, N13 and N14 of the transformer T1 are strongly coupled to one another via a shared iron or ferrite core. The coupling circuit allows the test signal U11 to be fed into and the measuring signal U12 to be coupled out of the individual lines of the power transmission line L1-L3 via the transformer T1 and the capacitors C11-C13. The transformer T1 provides for a galvanic decoupling of the generator device TX1 or the measuring device RX1 with respect to the medium voltage on the power supply line L1-L3.

The control device 20 is also configured to detect an interference signal, which is generated at an interference point 100 along the power transmission line L1-L3, to couple the an interference signal out from the power transmission line L1-L3 with the aid of the coupler and to detect the an interference signal as a measuring signal U12 with the aid of the measuring device RX1.

The interference point 100, 101 can be an interference point that is formed by an arc at the location of the arc. The interference point 100 results in the test signal U11 fed into the line K1-K3, L1-L3 generating an interference signal with intermodulation products, which can be detected by the processing device 10 as a measuring signal U12.

The processing device 10 is further configured to implement the inventive method and to determine the line property in the form of the arc from the measuring signal U12. Here the test signal U11 is coupled into the power transmission line L1-L3. An interference signal with intermodulation products is generated at the interference point 100 along the power transmission line L1-L3, which is caused by an arc, and is received again as the measuring signal U12.

The interference point 100 can appear along the power transmission line of the medium voltage network L1-L3 via an arc, but also along the power transmission line of the high voltage network K1-K3 as an interference point 101, wherein the transformer T0 over-couples signals at measuring frequencies in the measuring signal U12, i.e., intermodulation products, from one side K1-K3 to the other side L1-L3 of the transformer T0. Here, it may be necessary to provide corresponding measures which improve a wanted over-coupling with the relevant frequencies.

The line property is determined from the measuring signal U12, where the line property is an indicator of the occurrence of the interference point 100. The line property is determined by detecting an intermodulation product from the test signal U11 and the mains signal of the power transmission line K1-K3, L1-L3 in the measuring signal U12.

The intermodulation product in the measuring signal U12 is generated on an arc at the interference point 100 of the power transmission line L1-L3. The arc can be caused in a controlled manner by a switching process of a high voltage switch, such as a scissors isolator, along the power transmission line. As a result, the time instant of the switching process can be acquired or determined in advance. The instant in time at which the switching process occurs can be taken into account when determining the line parameter, in order to simplify the evaluation of the measuring signal U12.

The line property can also be determined by a plurality of intermodulation products. The line property can additionally be determined by a harmonic of the test signal U11. The test signal U11 is sinusoidal and narrowband, i.e., in this example test signal U11 has a ratio between the bandwidth and the mean frequency of below 1%. The test signal U11 lies at a frequency of 30 kHz and according to FIG. 3 lies at a frequency which is greater by a factor 600 than the mains frequency of e.g. 50 or e.g. 60 Hz of the power transmission line K1-K3, L1-L3.

Switching operations in electric power supply systems are generally accompanied by arcs. These can be incorrectly identified as errors. The switching operations are, however, known a priori. As a result, a corresponding error message can be suppressed.

Furthermore, a switching operation can also be used to test the function of the coupler and the measuring device, by a test signal being fed in at the same time as the switching operation and being evaluated accordingly. A communication signal of a Powerline Communication (PLC) system can also be used as a test signal.

The reference signal can be fed into any phase of the multiphase network. Similarly, the measuring signal can be coupled out.

The coverage of the method, i.e., the distance between a measuring device and an error location, can be restricted by regulatory determinations, such as a maximum permissible transmit power for PLC-type devices.

With large networks, it may therefore be necessary to provide a plurality of measuring devices. Here, measuring devices for reducing or preventing mutual interferences can operate on different frequencies.

With the knowledge of the precise phases of measuring signals at different locations, for instance, with the aid of a number of measuring devices, after synchronizing the measuring signals with the aid of reference signals or using a GPS time reference, the failure location can be restricted.

An evaluation of the phase-rotation of a measuring signal by taking actuated switching operations within the network into account can allow for a function check or an automatic recalibration of the distance determination, because the sites of the measuring devices and the actuated high voltage switch are well known.

Figure 2:
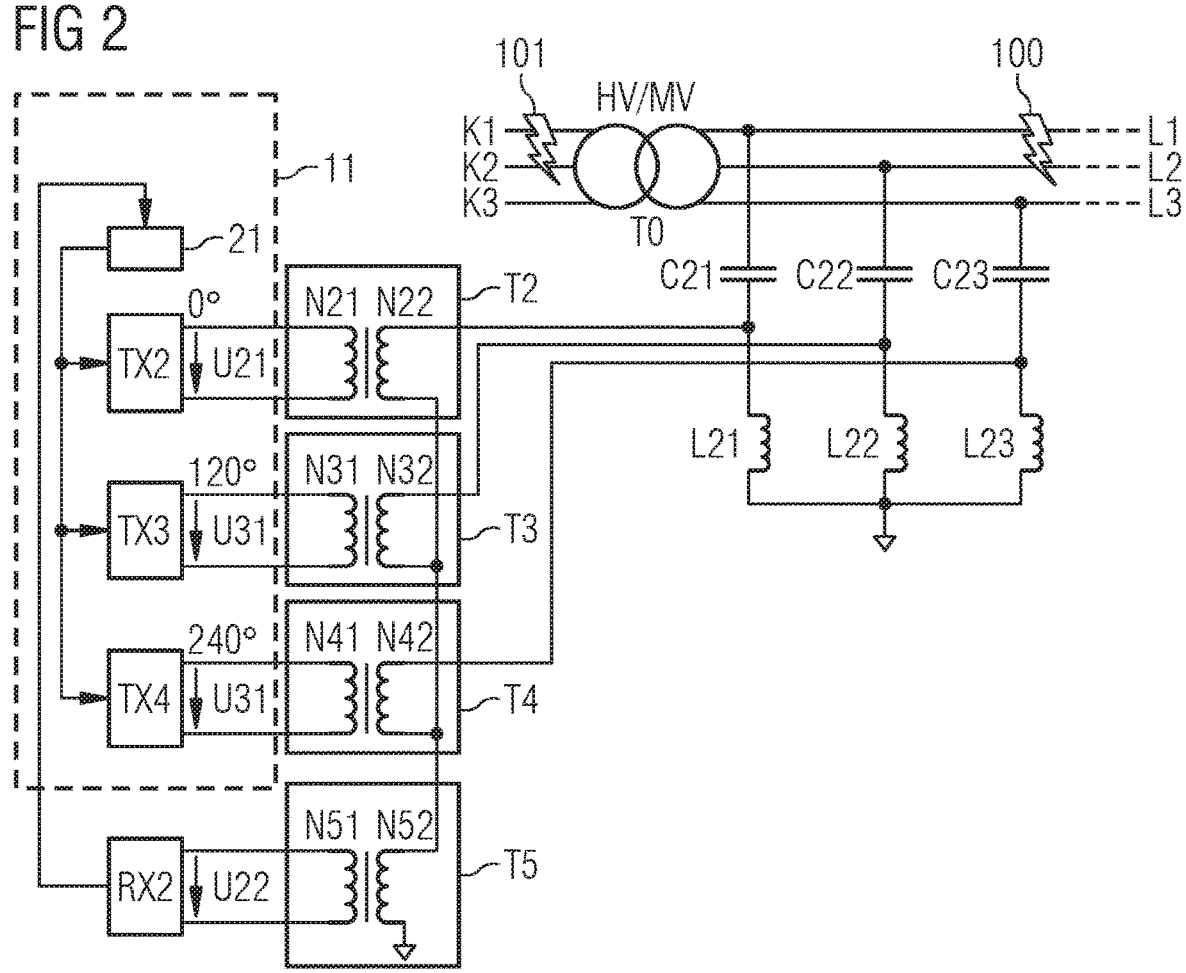
FIG. 2 a second exemplary embodiment of a block diagram of a circuit arrangement with a coupling of a three-phase reference signal to the virtual star point of the power transmission line in accordance with the invention.

FIG. 2 shows a second exemplary embodiment for an inventive device with a coupling of a three-phase reference signal to the virtual star point of the power transmission line.

The alternative feed-in of reference signals with the aid of a virtual star point allows for an ungrounded feed-in of a three-phase reference signal. Provision is made here for a separate test signal U21, U31, U41 to be generated by respective generators TX2-TX4 for each phase of the three-phase line K1-K3, L1-L3, and to be received by a receiver RX2 as an associated measuring signal U22. In this example, the coupler is formed from transformers T2-T5 with windings N21, N22, N31, N32, N41, N42, N51 and N52, capacitors C21-C23 and inductors L21-L23.

For a processing device 11 and a control device 21, the embodiments in FIG. 1 apply with respect to the measuring signal U12, and also for the aspects of the three-phase line K1-K3, L1-L3 and the interference point 100.

For both infeed embodiments of FIG. 1 and FIG. 2, the additional aspects mentioned further now apply.

It is favorable if a number of reference signals are applied with different amplitudes and frequency ranges in order to further increase the reliability of the interference detection via a repeated, adaptive measurement. Here, sweeps or cascades of predefined frequencies can be applied to the test signal, both in a single tone and also in a multi-tone method.

In addition to intermodulation products, harmonics of the respective reference signal can also be evaluated. The mains voltage can also be identified in the measuring signal in terms of frequency and phase As a result, phase-sensitive methods, such as a synchronous demodulation, can also be used to determine intermodulation products. This can allow for a finer distinction between the intermodulation sources. Furthermore, a greater signal-to-noise ratio can be achieved.

The test signal can have different signal sequences, such as sinusoidal, encoded or modulated. Moreover, the test signal can be modulated in a variety of ways and a corresponding identification can be performed with conventional digital signal processing methods.

In order to evaluate the non-linearity, the intermodulation products need not necessarily be used solely between the frequency of the reference signal and the mains frequency. When a test signal with two or more frequencies (multi-tone signal) is emitted and also when two or more reference signals are received at different frequencies with different test devices in the same line network, test signals and also their mixed products can also be observed among one another. Here, the proportions of the harmonic distortions of the mains voltage can be eliminated as a result of the fault. A classification of the identified line error occur based on the measured intermodulation products.

In a further exemplary embodiment, not shown, the coupler for a single-phase power supply line can be by a corresponding coupling circuit similarly to FIG. 1, but only with a single coupling capacitor relative to the power supply line.

Each of the following figures show examples of a sinusoidal measuring signal with a power 1 above a frequency range 2.

Figure 3:
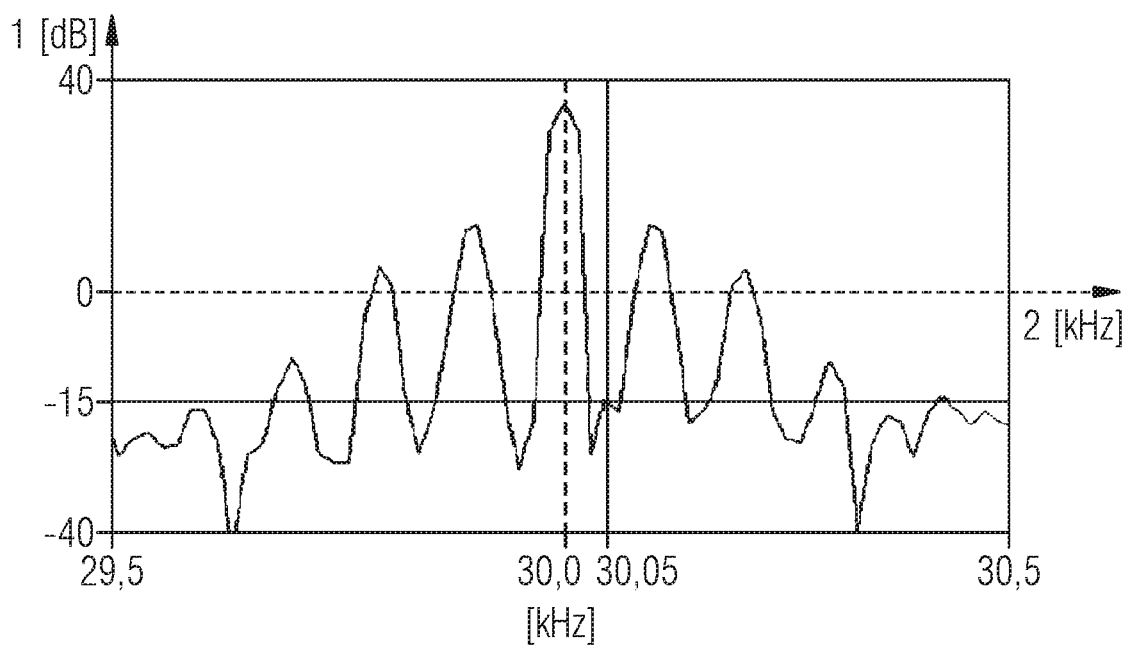
FIG. 3 a first exemplary graphical plot of a measuring signal which has intermodulation products.

FIG. 3 shows a first exemplary graphical plot of a sinusoidal measuring signal at a mean frequency of 30.0 kHz, which has odd-numbered intermodulation products, which can be used for an arc detection. Mixed products can be identified at 30 kHz±100 Hz, at 30 kHz±200 Hz and at 30 kHz±300 Hz. However, no mixed products can be identified at 30 kHz±50 Hz, at 30 kHz±150 Hz and at 30 kHz±250 Hz. The characteristic of a nonlinearity of an arc results in odd-numbered mixed products in the measuring signal. The characteristic of a non-linearity, which can be caused by system components in the medium voltage networks, such as those of transformers or capacitors, predominantly results in even-numbered mixed products in the measuring signal. Therefore, in addition to an amplitude difference between reflections of a test signal on system components, the type of mixed products (even number/odd number) in the measuring signal can consequently also be used to differentiate between causes of interference and is used to determine a line property in the form of an arc.

Figure 4:
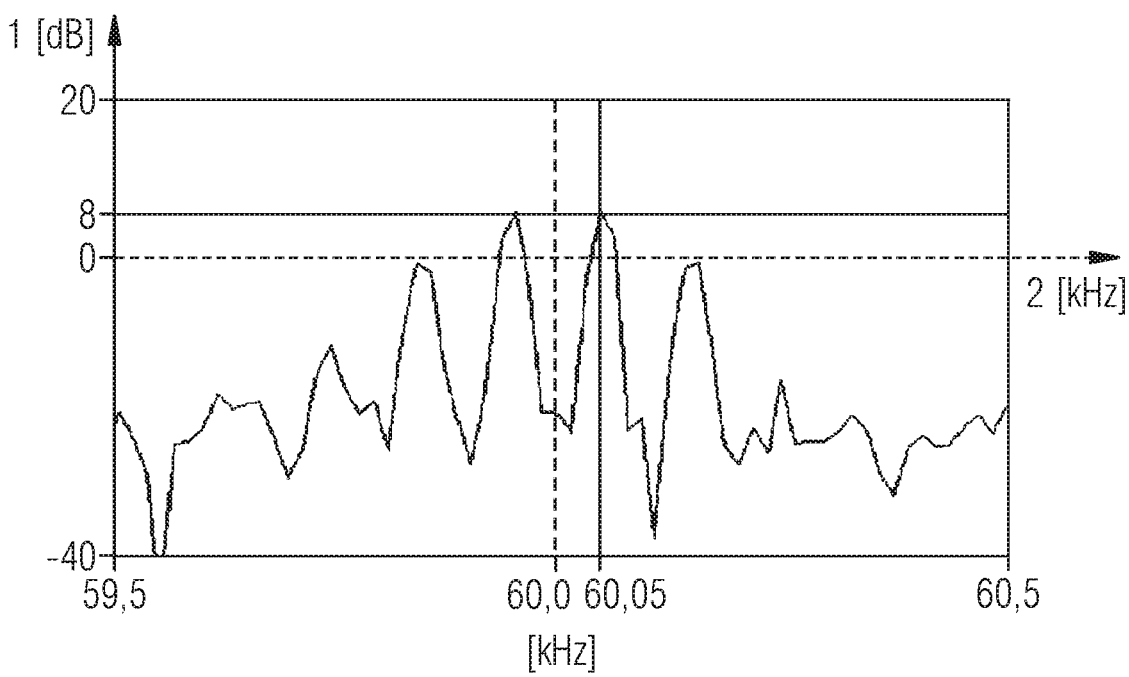
FIG. 4 a second exemplary graphical plot of a measuring signal which has intermodulation products.

FIG. 4 shows a second exemplary graphical plot of a sinusoidal test signal with a mean frequency of 30.0 kHz, but measured at its first harmonic frequency of 60.0 kHz, and that likewise has intermodulation products at 60.0 kHz. Mixed products can be identified at 60 kHz±50 Hz, at 60 kHz±150 Hz and at 60 kHz±250 Hz. However, no mixed products can be identified at 60 kHz±100 Hz and at 60 kHz±200 Hz.

Figure 5:
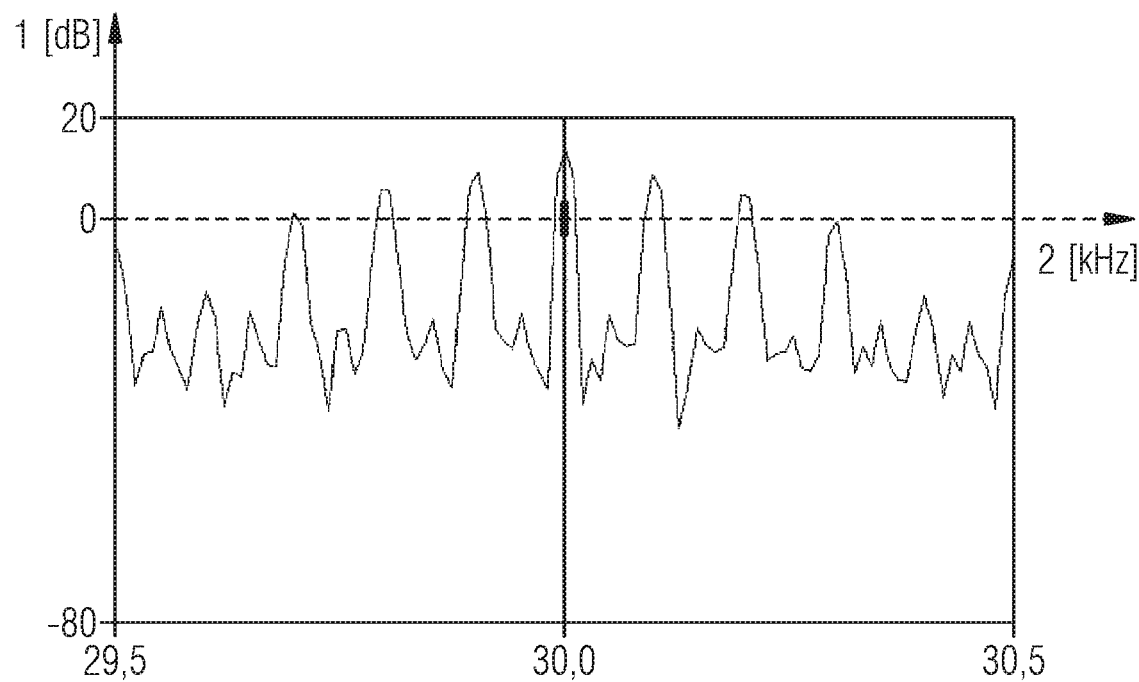
FIG. 5 a third exemplary graphical plot of a measuring signal which has no intermodulation products.

FIG. 5 shows a third exemplary graphical plot of a narrowband sinusoidal measuring signal with a mean frequency of 30.0 kHz, which has no intermodulation products. Consequently, there are no odd-numbered intermodulation products and therefore no arcs.

Figure 6:
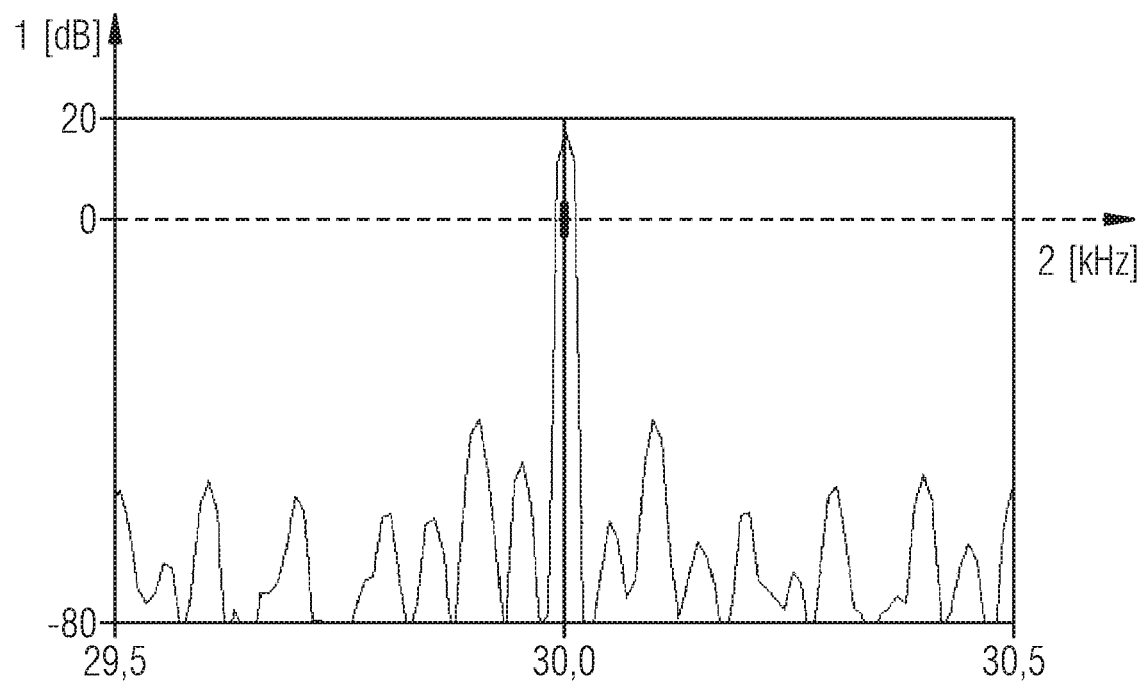
FIG. 6 a fourth exemplary graphical plot of a measuring signal which has intermodulation products.

FIG. 6 shows a fourth exemplary graphical plot of a narrowband sinusoidal measuring signal with a mean frequency of 30.0 kHz, which has intermodulation products. Odd-numbered intermodulation products can be identified at 30 kHz±100 Hz, at 30 kHz±200 Hz and at 30 kHz±300 Hz. The high intermodulation level, on the one hand, and the identification of odd-numbered intermodulation products, on the other hand, can be as a criterion for detecting an arc 100.

Figure 7:
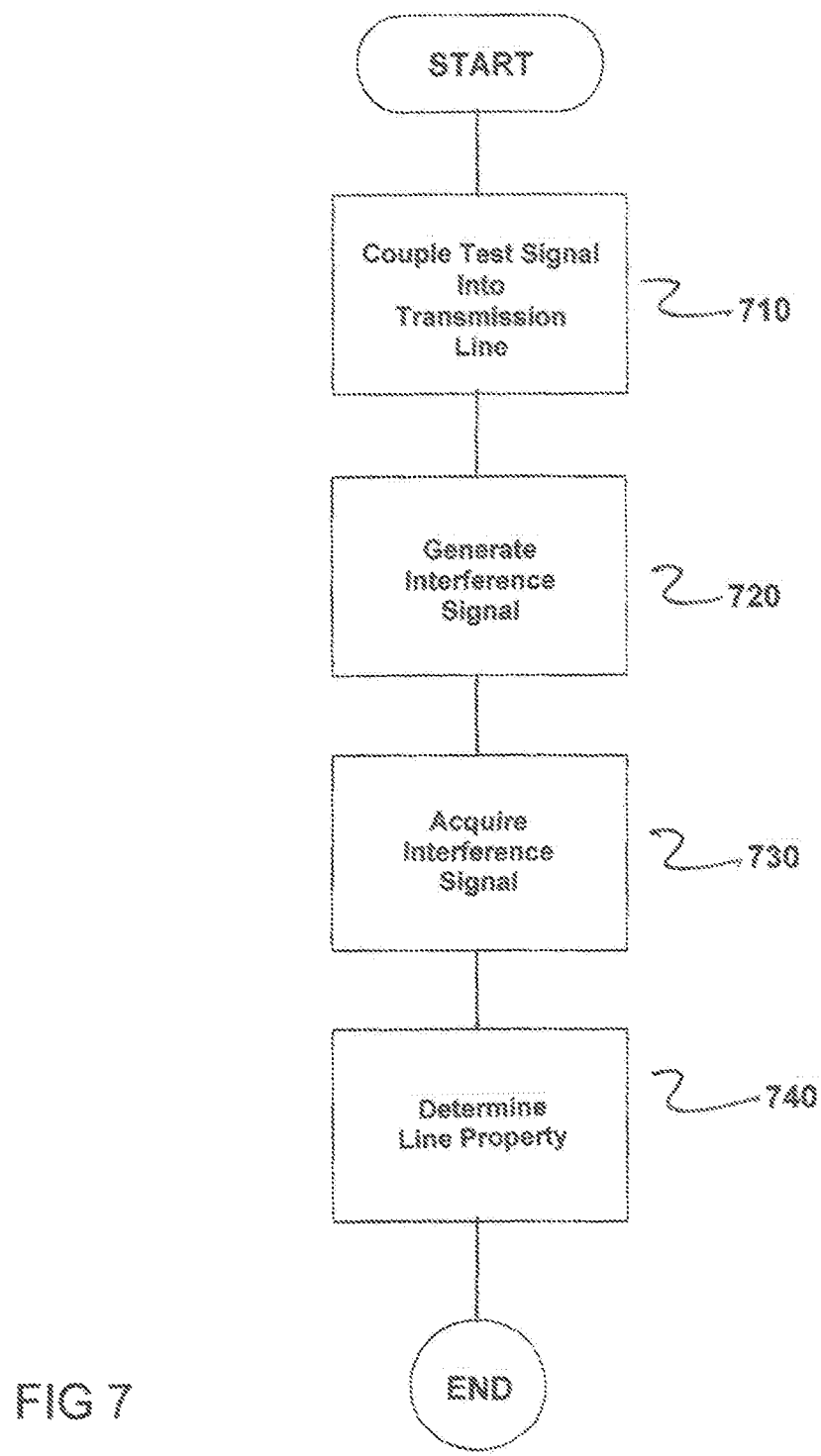
FIG. 7 is a flowchart of the method in accordance with the invention.

FIG. 7 is a flowchart of a method for determining a line property comprising an arc on a power transmission line K1-K3, L1-L3. The method comprises coupling at least one test signal U11, U21, U31, U41 into the power transmission line K1-K3, L1-L3, as indicated in step 710. Next, an interference signal at an interference point 100, 101, which is formed by the arc, along the power transmission line K1-K3, L1-L3 is generated via the at least one test signal U11, U21, U31, U41, as indicated in step 720.

Next, the interference signal is acquired as at least one measuring signal U12, U22, as indicated in step 730. Next, the line property is determined from the at least one measuring signal U12, U22 by detecting at least one intermodulation product from the at least one test signal U11, U21, U31, U41 and a mains signal of the power transmission line K1-K3, L1-L3 in the at least one measuring signal U12, U22, as indicated in step 740.

Thus, while there have been shown, described and pointed out fundamental novel features of the invention as applied to a preferred embodiment thereof, it will be understood that various omissions and substitutions and changes in the form and details of the methods described and the devices illustrated, and in theft operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for determining a line property comprising an arc on a power transmission line, the method comprising:
   acquiring, as at least one measuring signal, an interference signal generated at an interference point formed by an arc generated along the power transmission line, the interference signal being generated aided by at least one test signal coupled into the power transmission line; and
   determining the line property by detecting at least two intermodulation products of the at least one test signal and a mains signal of the power transmission line in the at least one measuring signal, a frequency of each of the at least two intermodulation products corresponding to a combination of frequencies of the at least one test signal and the mains signal of the power transmission line.

2. The method as claimed in claim 1, wherein the arc is caused by a switching process of a high voltage switch connected to the power transmission line.

3. The method as claimed in claim 2, wherein a time instant of the switching process is taken into account when at least one line parameter is determined.

4. The method as claimed in in claim 1, wherein the line property is determined by detecting odd-numbered intermodulation products.

5. The method as claimed in in claim 1, wherein the line property is determined by at least one intermodulation product up to the tenth order.

6. The method as claimed in claim 1, wherein the line property is determined by a ratio of at least one of (i) amplitude and (ii) phase delays of the at least two intermodulation products.

7. The method as claimed in claim 5, wherein the line property is additionally determined by at least one harmonic of at least one of (i) the at least one test signal and (ii) the at least one intermodulation product.

8. The method as claimed in in claim 1, wherein the at least one test signal has a ratio between a bandwidth and a mean frequency of less than 10%.

9. The method as claimed in in claim 8, wherein the ratio between the bandwidth and the mean frequency is less than 5%.

10. The method as claimed in in claim 9, wherein the ratio between the bandwidth and the mean frequency is less than one of 3% or 1.5%.

11. The method as claimed in claim 1, wherein the at least one test signal has a frequency which is greater by a factor 20 than the mains frequency of the power transmission line.

12. The method as claimed in claim 11, wherein the at least one test signal has a frequency which is greater by a factor 50 than the mains frequency of the power transmission line.

13. The method as claimed in claim 12, wherein the at least one test signal has a frequency which is greater by a factor 500 or 1000 than the mains frequency of the power transmission line.

14. The method as claimed in claim 1, wherein at least one phase delay relationship between the at least one test signal and the at least one measuring signal is determined and is utilized to determine a location of an occurrence of the interference point of the power transmission line.

15. A device for determining a line property in the form of an arc of a power transmission line, comprising:
at least one coupler for coupling at least one test signal into and for coupling at least one measuring signal out of the power transmission line;
a processing device including a control device, at least one generator and at least one measuring device;
wherein the control device is configured to:
generate the at least one test signal aided by the at least one generator, feed the at least one test signal into the power transmission line with the aid of aided by the at least one coupler,
couple, utilizing the at least one coupler, at least one interference signal out of the power transmission line, the at least one interference signal being is generated at least one interference point along the power transmission line aided by the at least one test signal, and
detect the at least one measuring signal aided by the at least one measuring device; and
wherein the processing device is configured to:
acquire, as at least one measuring signal, an interference signal generated at an interference point formed by an arc generated along the power transmission line, the interference signal being generated aided by at least one test signal coupled into the power transmission line; and
determine the line property by detecting at least two intermodulation products of the at least one test signal and a mains signal of the power transmission line in the at least one measuring signal, a frequency of each of the at least two intermodulation products corresponding to a combination of frequencies of the at least one test signal and the mains signal of the power transmission line.

16. The device as claimed in claim 15, wherein the power transmission line comprises one of (i) an overhead line, (ii) a cable, (iii) a gas-insulated line and (iv) an overhead contact wire for an electrically operated means of transport.

17. A system for determining a line property comprising of an arc on a power transmission line in the form of an overhead contact wire, comprising an electrically operated means of transport with a current collector for connection to the overhead contact wire and the device as claimed in claim 15, wherein the interference point is formed by an arc between the overhead contact wire and the current collector.

* * * * *